(12) United States Patent
Held (10) Patent No.: US 6,509,270 B1
(45) Date of Patent: Jan. 21, 2003

(54) METHOD FOR POLISHING A SEMICONDUCTOR TOPOGRAPHY

(75) Inventor: Ruediger Held, Minneapolis, MN (US)

(73) Assignee: Cypress Semiconductor Corp., San Jose, CA (US)

( * ) Notice: Subject to any disclaimer, the term of this patent is extended or adjusted under 35 U.S.C. 154(b) by 0 days.

(21) Appl. No.: 09/823,530

(22) Filed: Mar. 30, 2001

(51) Int. Cl.[7] .............................................. H01L 21/302
(52) U.S. Cl. ....................... 438/691; 438/690; 438/692; 438/693
(58) Field of Search ........................... 257/618; 438/690, 438/691, 692, 693; 451/41

(56) References Cited

U.S. PATENT DOCUMENTS

| | | | |
|---|---|---|---|
| 4,193,226 A | | 3/1980 | Gill, Jr. et al. |
| 4,811,522 A | | 3/1989 | Gill, Jr. |
| 5,421,769 A | | 6/1995 | Schultz, et al. |
| 5,584,746 A | * | 12/1996 | Tanaka et al. ............... 451/41 |
| 6,010,964 A | | 1/2000 | Glass |
| 6,020,262 A | * | 2/2000 | Wise et al. ................ 438/691 |
| 6,171,513 B1 | * | 1/2001 | Davis et al. ................ 216/88 |
| 6,203,408 B1 | * | 3/2001 | Quek ........................ 451/141 |
| 6,340,326 B1 | * | 1/2002 | Kristler et al. .............. 451/286 |
| 6,344,414 B1 | * | 2/2002 | Davis et al. ................ 438/692 |
| 6,368,968 B1 | * | 4/2002 | Hsu ........................... 438/689 |

OTHER PUBLICATIONS

Malkoe et al., "Effect of Retaining Ring System on the Polishing of 300 mm Oxide Wafers", Mar. 2001, pp. 519–522.

* cited by examiner

*Primary Examiner*—Richard Elms
*Assistant Examiner*—Douglas Menz
(74) *Attorney, Agent, or Firm*—Kevin L. Daffer; Conley, Rose & Tayon P.C.

(57) ABSTRACT

A method is provided for processing a semiconductor topography. In particular a method is provided in which a greater pressure may be applied to a first portion of a semiconductor topography than in a second portion of the topography. As such, a method is provided in which a portion of an upper layer in a region adjacent to an outer edge of the semiconductor topography is polished at a faster rate than a portion of the upper layer in a region comprising the center of the topography. Consequently, the method may subsequently provide a manner in which a substantially planar upper surface may be formed across a semiconductor topography including a region adjacent to an outer edge of the semiconductor topography. Alternatively, regions of an upper layer of a semiconductor topography polished at a faster rate than other regions may occur at various locations across the topography.

23 Claims, 6 Drawing Sheets

METHOD FOR POLISHING A SEMICONDUCTOR TOPOGRAPHY

BACKGROUND OF THE INVENTION

1. Field of the Invention

This invention relates to semiconductor device manufacturing, and more particularly, to improved methods and systems for polishing a semiconductor topography.

2. Description of the Related Art

The following descriptions and examples are not admitted to be prior art by virtue of their inclusion within this section.

Fabrication of an integrated circuit involves numerous processing steps. After implant regions (e.g., source/drain regions) have been placed within a semiconductor substrate and gate areas defined upon the substrate, an interlevel dielectric is formed across the topography to isolate the gate areas and the implant regions from overlying conducting regions. Interconnect routing is then placed over the interlevel dielectric and connected to the implant regions and/or the gate areas by ohmic contacts formed through the interlevel dielectric. Alternating levels of interlevel dielectric and interconnect may be placed across the semiconductor topography to form a multi-level integrated circuit.

Forming substantially planar upper surfaces of a semiconductor topography during intermediate process steps may facilitate fabrication of layers and structures that meet design specifications. For example, a dielectric layer may be formed across a previously patterned layer of a semiconductor topography using a process such as chemical vapor deposition ("CVD"). Elevational disparities of the deposited dielectric layer may be reduced by planarizing the deposited dielectric layer using a process such as chemical mechanical polishing ("CMP"). A contact opening may be formed within the planarized dielectric layer and subsequently filled with a layer of conductive material. In this manner, the layer of conductive material may be formed within the contact opening and on an upper surface of the planarized dielectric layer. As such, the layer of conductive material may also be planarized such that an upper surface of the contact structure may be substantially planar with an upper surface of the dielectric layer.

Additional layers and structures may be formed upon the contact structures and the dielectric layer. The additional layers and structures may include, for example, additional dielectric layers, additional contact structures, local interconnect wires, and/or metallization layers. In this manner, the planarized upper surface of the contact structures and the dielectric layer may facilitate the formation of such additional layers and structures having uniform vertical and lateral dimensions. For example, the planarization of the semiconductor topography may facilitate the formation of local interconnect structures having a substantially uniform thickness by providing a planar surface upon which a dielectric material may be deposited to insulate adjacent local interconnect structures. Moreover, the planarization of the semiconductor topography may aid in forming local interconnect structures having uniform lateral dimension by providing a planar surface upon which a patterned masking layer may be formed. In this manner, a masking layer may be accurately patterned by a lithography technique such that the pattern may be accurately transferred to a dielectric layer to form local interconnect structures. Accordingly, layers and structures of a semiconductor device may be formed having dimensions which are approximately equal to the design specifications of the semiconductor device.

Forming a substantially planar upper surface of such layers and structures may play an important role in the functionality of a semiconductor device. For example, problems with step coverage may arise when a dielectric, conductive, or semiconductive material is deposited over a topological surface having elevationally raised and recessed regions. Step coverage is defined as a measure of how well a film conforms over an underlying step and is expressed by the ratio of the minimum thickness of a film as it crosses a step to the nominal thickness of the film over horizontal regions. Furthermore, substantially planar surfaces may become increasingly important as the feature sizes of semiconductor devices are reduced, since the depth of focus required to pattern an upper surface of a semiconductor topography may increase with reductions in feature size. If a topography is nonplanar, the patterned image may be distorted and the intended structure may not be formed to the specifications of the device. Furthermore, correctly patterning layers upon a topological surface containing fluctuations in elevation may be difficult using optical lithography. The depth-of-focus of the lithography alignment system may vary depending upon whether the resist resides in an elevational "hill" or "valley" area. The presence of such elevational disparities therefore makes it difficult to print high resolution features.

As mentioned above, CMP is a technique commonly employed to planarize or remove the elevational fluctuations in the surface of a semiconductor topography. A conventional CMP process may involve placing a semiconductor wafer face-down on a polishing pad which lies on or is attached to a rotatable table or platen. A typical polishing pad medium may include polyurethane or polyurethane-impregnated polyester felts. During the CMP process, the polishing pad and the semiconductor wafer may be rotated relative to each other as the wafer is forced against the pad. An abrasive, fluid-based chemical suspension, often referred to as a "slurry," may be deposited onto the surface of the polishing pad. The slurry fills the space between the polishing pad and the wafer surface such that a chemical in the slurry may react with the surface material being polished. The rotational movement of the polishing pad relative to the wafer causes abrasive particles entrained within the slurry to physically strip the reacted surface material from the wafer. In addition, the pad itself may physically remove some material from the surface of the semiconductor topography. Therefore, the process may employ a combination of chemical stripping and mechanical polishing to form a planarized surface.

Unfortunately, a CMP process may not form a substantially planar surface across an entire semiconductor topography. For example, if the polishing rate of CMP varies across a topography, a planarized semiconductor topography may have substantial elevational disparities. Such disparities may be particularly prevalent at an edge of the topography. For example, a thickness of a semiconductor topography may be greater at the edge of the topography than at an inner portion of the topography. The greater thickness of the semiconductor topography at its edge may be due to a slow polish rate at the edge of the topography as compared to polish rates at other regions of the topography. Several factors may influence the polish rates of a CMP process. For example, the polish rates may depend on the surface materials being polished or the rotational and lateral movement of the polishing pad relative to the semiconductor topography. Additional factors which may affect polish rates of the CMP process may include elements such as the polishing tool, the pad materials, the slurry, and interactions between these elements.

Elevational disparities which may be present on a semiconductor topography subsequent to chemical mechanical polishing may inhibit the formation of semiconductor devices on a portion of the semiconductor topography. For example, a thickness of the semiconductor topography may be greater at an outer edge of the semiconductor topography than at an inner portion of the semiconductor topography. As such, the thickness of the semiconductor topography at the outer edge may be outside of design specifications for a semiconductor device. Consequently, semiconductor devices formed at the outer edge of such a semiconductor topography may have dimensions which deviate significantly from design specifications. In this manner, acceptable devices may not be formed on an area of the semiconductor topography having such elevational disparities, thereby reducing the number of devices which may be formed on the semiconductor topography. As such, the presence of such elevational disparities on a semiconductor topography may reduce manufacturing yield and may increase production costs per semiconductor device.

Accordingly, it would be advantageous to develop a method and a system for forming a semiconductor topography having a substantially planar upper surface across the entire semiconductor topography, including its outer edge.

SUMMARY OF THE INVENTION

The problems outlined above may be in large part addressed by a method, a wafer carrier, components of a wafer carrier, and a CMP system adapted for processing a semiconductor topography. In particular, a method is provided in which a greater pressure may be applied to a first portion of a semiconductor topography than in a second portion of the topography. As such, the first portion of the topography may be polished at a faster rate than the second portion of the topography. For instance, a portion of an upper layer in a region adjacent to an outer edge of the semiconductor topography may be polished at a faster rate than a portion of the upper layer in a region comprising the center of the topography. Consequently, the method may subsequently provide a manner in which a substantially planar upper surface may be formed across a topography including a region adjacent to an outer edge of the topography. In addition, a system is provided in which a greater pressure may be applied in a first portion of a semiconductor topography than in a second portion of the topography during a polishing process. The first portion may, for example, be adjacent to an outer edge of the topography, while the second portion may include the center of the topography. Alternatively, the first portion and second portion of the topography may each include any region of the topography.

The method preferably includes two steps with which to form a substantially planar surface. For example, the method may include a polish step, which may polish a region adjacent to the outer edge of the topography at a faster rate than a region including the center of the topography. Such a process may be achieved by applying greater pressure at the region adjacent to the outer edge of the topography than a region including the center of the topography. The polish step may compensate for elevational disparities, which may have been formed within an upper layer of a semiconductor topography. Thus, the method may form a substantially planar upper surface across the entirety of the semiconductor topography. The method may also include a planarization step, which may precede or follow the polish step. The planarization step preferably has a substantially different polish rate profile than the polish step. In particular, the planarization step may polish a region adjacent to the outer edge of the topography at a slightly slower rate than a region including the center of the topography. In an embodiment, the planarization step may apply a substantially uniform pressure across the topography to obtain its polish rate profile. In another embodiment, the planarization step may assert a substantially uniform pressure across the topography except in the region adjacent to the outer edge of the topography.

In one embodiment, a CMP system may be adapted to apply a greater pressure in one or more regions of the semiconductor topography as compared to another regions of the topography when the topography is pressed against a polishing pad. The CMP system may include a carrier plate and/or a carrier backing film adapted to apply varying degrees of pressure across a topography. As such, a CMP system may be adapted to apply a greater pressure in a region of a semiconductor topography adjacent its outer edge than in a region comprising the center of the topography. In one embodiment, the region of the topography adjacent to the outer edge may extend inward from the outer edge by an amount between approximately 1 mm and approximately 10 mm. More specifically, the region adjacent to the outer edge of the topography may extend inward from the outer edge by an amount between approximately 2 mm and approximately 4 mm.

A wafer carrier may be adapted to apply a greater pressure in specified regions of the semiconductor topography as compared to other regions of the topography during a polishing process. As with the CMP system, a wafer carrier may include a carrier plate and/or a carrier backing film adapted to apply a greater pressure in a first portion of a semiconductor topography than in a second portion of the topography. In this manner, such a wafer carrier may be included in a CMP system to allow varying degrees of pressure to be applied to the semiconductor topography. The application of pressure within a polishing process is generally dependent upon the interface between the backing film and the semiconductor topography. As such, the CMP system and wafer carrier as described herein allow the carrier backing film to contact at least a portion of the topography during the polishing process. The wafer carrier and/or CMP system may also include a carrier ring configured to hold the semiconductor topography in alignment with the film.

There are several embodiments in which a carrier backing film may be adapted to apply a greater pressure in one or more portions of a semiconductor topography than in other portions of the topography when the topography is pressed against a polishing pad. In particular, a carrier backing film may be adapted to apply a greater pressure in a first portion of a semiconductor topography than in a second portion of the topography when the topography is pressed against a polishing pad. For example, a backing film may be formed such that the lateral dimensions of the film may be approximately equal to lateral dimensions of the first portion of the semiconductor topography. In one embodiment, the first portion may extend inward from an outer edge of the topography by an amount between approximately 1 mm and approximately 10 mm. As such, an outer diameter of the film may be larger than an inner diameter of the film by an amount between approximately 2 mm and approximately 20 mm. Alternatively, the backing film may include a layer of varied thickness. More specifically, a region of the layer corresponding to the first portion of the semiconductor topography may be thicker than a region of the layer corresponding to the second portion of the semiconductor topography. Regions of the backing film corresponding to portions of the semiconductor topography may refer to the mirrored lateral dimensions of the regions and portions of the two components.

A carrier plate may also be adapted to apply a greater pressure in one or more regions of the topography than in other regions of the topography when the topography is pressed against a polishing pad. As such, a carrier plate may be adapted to apply a greater pressure in a first portion of the topography than in a second portion of the topography when the topography is pressed against a polishing pad. Such an adaptation of a carrier plate may be in addition to the backing film adaptation as described above or may be a completely independent system. In one embodiment, the carrier plate may include a recessed portion. A backing film may include a continuous layer formed across and upon the side of the carrier plate including the recessed region. In alternative embodiment, the backing film may be attached only to a region of the carrier plate adjacent to the recessed region. The lateral dimensions of the recessed portion may be approximately equal to the lateral dimensions of the second portion of the topography. For example, the diameter of the recessed portion may be less than a diameter of the carrier plate by an amount between approximately 2 mm and approximately 20 mm. As such, the diameter of the second portion of the topography may be less than a diameter of the carrier plate by an amount between approximately 2 mm and approximately 20 mm. The depth of the recessed portion may influence the onset of polishing and consequently the polish rate of the second portion of the topography. Accordingly, the depth of the recessed portion may correspond to a thickness variation between the first and second portions of an upper layer of the topography. In this manner, the depth of the recessed portion may vary depending on the design specifications of the device (i.e., an integrated circuit). In particular, the depth of the recessed portion may be optimized such that a substantially planar upper surface of the semiconductor topography may be obtained by a subsequent planarization process.

As previously stated, a method is provided herein in which a portion of an upper layer in a region adjacent to an outer edge of the semiconductor topography is polished at a faster rate than a portion of the upper layer in a region comprising the center of the topography. More specifically, the method may include polishing an upper layer of a semiconductor topography such that an average thickness of the upper layer in a region adjacent to an outer edge of the topography may be less than an average thickness of the upper layer in a region comprising the center of the topography. In one embodiment, the thickness of the upper layer in the region adjacent to the outer edge of the semiconductor topography may increase gradually going inward from the outer edge of the topography. In contrast, the thickness of the upper layer in the region comprising the center of the topography may be substantially uniform subsequent to polishing. In an embodiment, the region adjacent to the outer edge of the semiconductor topography may extend inward from the outer edge by an amount between approximately 1 mm and approximately 10 mm. More specifically, the region adjacent to the outer edge of the topography may extend inward from the outer edge by an amount between approximately 2 mm and approximately 4 mm.

As stated above, the process of polishing an upper layer of a semiconductor topography may include polishing the portion of the upper layer in the region adjacent to an outer edge of the semiconductor topography at a faster rate than a portion of the upper layer in a region comprising the center of the semiconductor topography. For example, the polishing rate of the upper layer in a region adjacent to the outer edge may be between approximately 4,000 angstroms/minute and approximately 7,000 angstroms/minute. In contrast, the polishing rate of the upper layer in the region including the center of the topography may be between approximately 500 angstroms/minute and approximately 1,000 angstroms/minute. As such, the portion of the semiconductor topography polished by the polish step may include the region extending from the outer edge of the semiconductor topography and the region including the center of the topography. However, a greater amount of the topography may be removed in the region extending from the outer edge of the topography than from the region comprising the center of the topography since the polishing rate is so much greater at the edge of the topography. The polishing rate variation across the topography may vary, however, depending on the design specifications of the device. In particular, the polishing rates of the method as described herein may be optimized such that a substantially planar upper surface of the semiconductor topography may be obtained by a subsequent planarization process.

In conjunction with the aforementioned systems, the method as described herein may comprise placing a semiconductor topography upon a carrier plate with a carrier backing film interposed between at least a portion of the wafer and the plate. In one embodiment, the polishing process may include a CMP process. The backing film may comprise, for example, a continuous layer conformably formed across and upon a surface of the plate. The plate may comprise a recessed section such that only a segment of the backing film contacts the semiconductor wafer prior to polishing. The lateral dimensions of the segment may be approximately equal to the lateral dimensions of the region adjacent to the outer edge of the semiconductor topography. Alternatively, the carrier backing film may comprise a ring aligned with an outer portion of the carrier plate. The lateral dimensions of the ring may be approximately equal to the lateral dimensions of the region adjacent to the outer edge of the semiconductor topography. The backing film ring may be replaced with a continuous backing film layer prior to or after a planarizing step, when the polishing and planarizing processes are performed on the same system. Alternatively, the polishing process and subsequent planarizing process may be performed on two separate systems so that the backing film does not have to be changed.

The method may further include a planarizing step conducted before or after the polishing process such that an upper surface of the semiconductor topography is substantially planar. In this manner, the thickness of the upper layer of the semiconductor topography may be approximately the same across the entirety of the semiconductor topography. For example, the thickness variation of the upper layer across the entirety of the semiconductor topography may be less than approximately 700 angstroms. In one embodiment, the thickness variation of the planarized upper layer across the entirety of the semiconductor topography may be less than approximately 350 angstroms. Planarizing may include polishing the semiconductor topography at a substantially different polish rate profile than the polishing step. In particular, the polishing rate of the region adjacent to the outer edge of the semiconductor topography may be slightly slower than the polishing rate of the region comprising the center of the topography. For example, the polish rate of an upper layer in the region including the center of the topography may be between approximately 2500 angstroms/minute and approximately 2700 angstroms/minute. By contrast, the polish rate of the upper layer in the region adjacent to the outer edge of the topography may be between approximately 2000 angstroms/minute and approximately 2500 angstroms/minute.

The polish rate variation across the topography may be due to a number of variables involved in the planarization process. In an embodiment, the planarization step may apply a substantially uniform pressure across the topography to obtain its polish rate profile. In another embodiment, the planarization step may assert a substantially uniform pressure across the topography except in the region adjacent to the outer edge of the topography. In one embodiment, planarizing may include a CMP process. In such an embodiment, the CMP system may not include the modified wafer carrier components as may be used in the polishing step. In other words, the CMP system used for the planarization step may include a CMP system configuration commonly used in semiconductor fabrication. Alternatively, the planarization step may include any process which polishes a region at the outer edge of the topography at a slightly slower rate than a region including the center of the topography.

There may be several advantages to forming a substantially planar upper surface upon a semiconductor topography. For example, a semiconductor device may be formed approximately 4 mm from the outer edge of a semiconductor substrate. The formation of semiconductor devices within such a relatively close vicinity of the outer edge of the substrate may allow for an increase in the number of devices that may be formed upon a substrate. Such an increase in semiconductor device formation upon a substrate may increase manufacturing yield and may reduce production costs per semiconductor device.

A semiconductor topography formed by the method is also contemplated herein. The semiconductor topography may include an upper layer formed upon a lower layer. The average thickness of the upper layer in a region adjacent to an outer edge of the semiconductor topography may be less than an average thickness of the upper layer in a region including a center of the topography. In one embodiment, the thickness of the upper layer in the region adjacent to the outer edge of the semiconductor topography may increase gradually going inward from the outer edge of the topography. The region adjacent to the outer edge may extend laterally from the outer edge of the semiconductor topography by an amount between approximately 1 mm and approximately 10 mm. In one embodiment, the region extending laterally from the outer edge of the semiconductor topography may be between approximately 2 mm and approximately 4 mm. The structure arranged in a region adjacent to an outer edge may include at least a portion of a semiconductor device. Such a semiconductor topography may include, therefore, a semiconductor device arranged in a region approximately 4 mm extending laterally from the outer edge of the semiconductor topography.

BRIEF DESCRIPTION OF THE DRAWINGS

Other objects and advantages of the invention will become apparent upon reading the following detailed description and upon reference to the accompanying drawings in which.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

Figure 1:
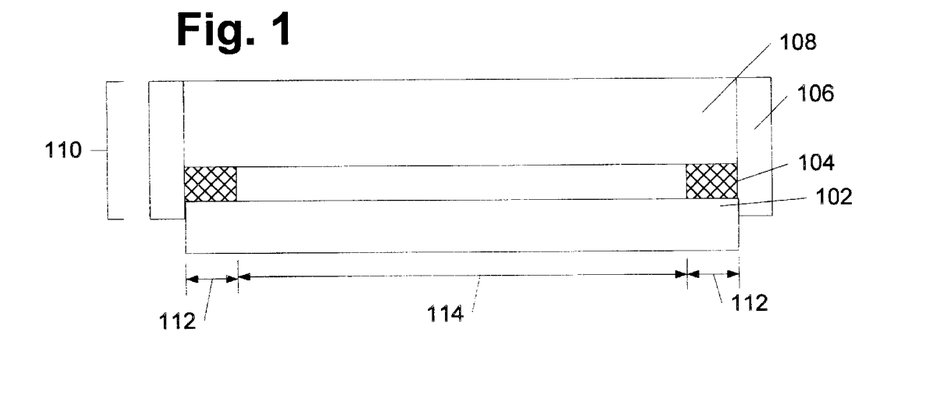
FIG. 1 depicts a partial cross-sectional view of a semiconductor topography placed in a wafer carrier, wherein the wafer carrier includes a carrier backing film in the shape of a ring.

Turning to the drawings, exemplary embodiments of a wafer carrier, associated components of the wafer carrier, and a CMP system for processing a semiconductor topography are illustrated in FIGS. 1–4. A method for processing a semiconductor topography using such embodiments is shown in FIGS. 5–14. FIG. 1 depicts wafer carrier 110, which includes carrier backing film 104, carrier plate 108, and carrier ring 106. Backing film 104 is attached to carrier plate 108 in a manner in which to receive semiconductor topography 102. Semiconductor topography 102 may be placed in wafer carrier 110 such that backing film 104 contacts at least a portion of the topography. Carrier ring 106 is preferably configured to hold semiconductor topography 102 in alignment with backing film 104. Subsequently, semiconductor topography 102 may be pressed against a polishing pad to polish the topography. Such a system may apply a greater pressure in a first portion of the semiconductor topography than in a second portion of a semiconductor topography.

Semiconductor topography 102 may be a semiconductor substrate with a substantially planar surface. Alternatively, semiconductor topography 102 may include one or more layers, such as dielectric or metallization layers, formed upon a semiconductor substrate. Another embodiment may include one or more structures, such as gate structures, contact structures, and local interconnect wires, formed upon or within a semiconductor substrate. And yet another embodiment may include diffusion regions and/or isolation regions formed upon or within a semiconductor substrate. In addition, one or more layers, structures, and/or regions may be combined to form semiconductor topography 102. Such layers and structures may form a substantially planar or nonplanar upper surface. The upper surface may be polished and/or planarized by the system as described herein in an effort to form a substantially planar upper surface, reduce the thickness of an upper layer of the topography, and/or remove surface irregularities of a semiconductor topography.

Figure 2:
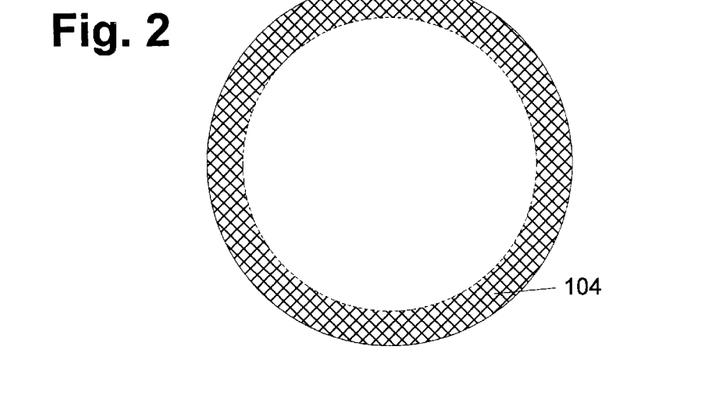
FIG. 2 depicts a top view of a carrier backing film used in the wafer carrier of FIG. 1.

As shown in FIG. 2, backing film 104 may be a ring which is sized to align with the outer edge of carrier plate 108. In an embodiment, an outer diameter of backing film 104 may be approximately 4 mm to approximately 20 mm larger than its inner diameter. Alternatively, backing film 104 may include any lateral dimensions, which may or may not be aligned with the outer edge of carrier plate 108. In this manner, backing film 104 may be a variety of shapes and sizes. Such configurations may allow the carrier backing film to apply a greater pressure in a first portion of a semiconductor topography than in a second portion of a semiconductor topography. For instance, backing film 104 in FIG. 1 is adapted to apply a greater pressure in region 112 of semiconductor topography 102 than in region 114 of semiconductor topography 102. In other embodiments, however, the first portion may not include the outer edge of the topography, since backing film 104 may not necessarily be positioned at a corresponding outer edge of the carrier plate. Since backing film 104 may be a component of wafer carrier 110, wafer carrier 110 may thereby be adapted to apply a greater pressure in a first portion of the semiconductor topography 102 than in a second portion of semiconductor topography 102.

Backing film 104 may include a variety of materials as recognized by one skilled in the art of semiconductor fabrication. In particular, backing film 104 may comprise materials that are typically interposed between a carrier plate and the backside of a semiconductor topography during the utilization of wafer carriers and/or CMP systems. In one embodiment, backing film 104 may comprise a similar material to that of Carrier Film DF 200, commercially available by Rodel of Newark, Del. In addition, the thickness of backing film 104 may be substantially similar to the thickness of the backing films known to those skilled in the art. For example, backing film layer 104 may have a thickness between approximately 0.1 mm and approximately 3.0 mm. However, the thickness of the backing film layer may be less or greater depending on the design specifications of the polishing process.

Figure 3:
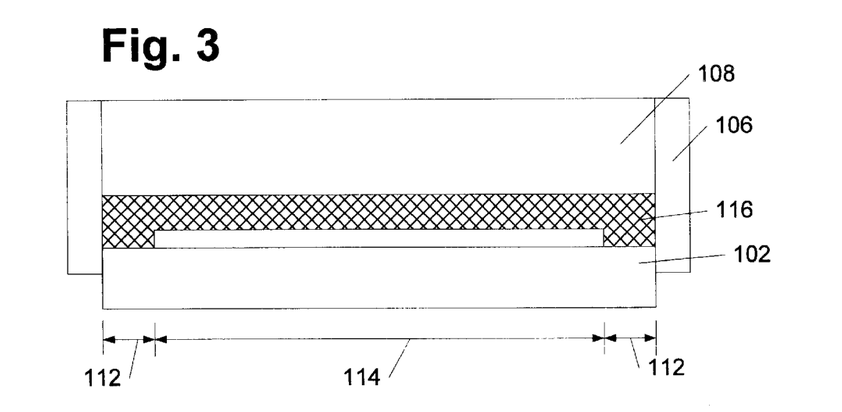
FIG. 3 depicts a partial cross-sectional view of a semiconductor topography placed in a wafer carrier, wherein the wafer carrier includes a carrier backing film of varied thickness.

An alternative embodiment of the wafer carrier as described herein is illustrated in FIG. 3. As in FIG. 1, the wafer carrier includes carrier plate 108 and carrier ring 106. However, a new configuration of a backing film is illustrated, which includes a layer of varied thickness formed upon and across carrier plate 108. As with backing film 104 in FIG. 1, backing film layer 116 in FIG. 3 may be adapted to apply a greater pressure in a first portion of semiconductor topography 102 than in a second portion of semiconductor topography 102. For instance, a greater pressure may be applied to region 112 than in region 114 of semiconductor topography 102. Alternatively, greater pressure may be applied to any region of semiconductor topography 102 in order to meet the design specifications of the device. The distribution of pressure may be influenced by the thickness of backing film layer 116. In particular, the region of the film layer corresponding to the portion of the topography receiving the greater pressure may be thicker than a region of the film layer corresponding to the portion of the topography receiving less pressure, comparatively. Regions of the backing film corresponding to portions of the semiconductor topography may refer to the mirrored lateral dimensions of the regions and portions of the two components. For example, in FIG. 3, backing film layer 116 may be thicker in a region corresponding to region 112 of semiconductor topography 102. Therefore, the wafer carrier may apply a greater pressure in region 112 than in region 114 of the topography. As previously stated, backing film layer 116 may be adapted to apply a greater pressure in any portion of semiconductor topography 102. As such, the thickness variation of backing film layer 116 may vary depending on the design specifications of the device.

Chemical and mechanical abrasion may be used as the polishing process and is commonly referred to as chemical-mechanical polishing ("CMP"). As such, the equipment used in this process may be referred to as a CMP system. A typical CMP process may involve placing a semiconductor topography face-down on a polishing pad which may be fixedly attached to a rotatable table or platen. The polishing pad may be made of various substances, depending on the material being polished. A popular polishing pad medium includes polyurethane or polyurethane-impregnated polyester felts. During the CMP process, the polishing pad and the semiconductor topography may be rotated while a carrier holding the semiconductor topography applies a downward force upon the polishing pad. An abrasive, fluid-based chemical, often referred to as a "slurry", may be deposited upon the surface of the polishing pad. The slurry may occupy an interface between the polishing pad and the surface of the semiconductor topography. As such, elevationally extending features of the semiconductor topography may be positioned such that they may contact the chemical slurry. The slurry may initiate the polishing process by chemically reacting with the surface material being polished. The rotational movement of the polishing pad relative to the semiconductor topography may cause abrasive particles entrained within the slurry to physically strip the reacted surface material from the semiconductor topography. Such abrasive slurry particles may include, for example, silica, alumina, or ceria. Alternatively, a polishing solution substantially absent of abrasive particles may be used with an abrasive polish surface. Some factors that may influence the effect of any polishing solution used include the pH of the solution, the flow dynamics at the pad and semiconductor topography interface, and the etch selectivity of the solution with respect to materials within the semiconductor topography. A post-CMP cleaning step may be required to remove residual slurry particles from the surface of the polished topography.

Figure 4:
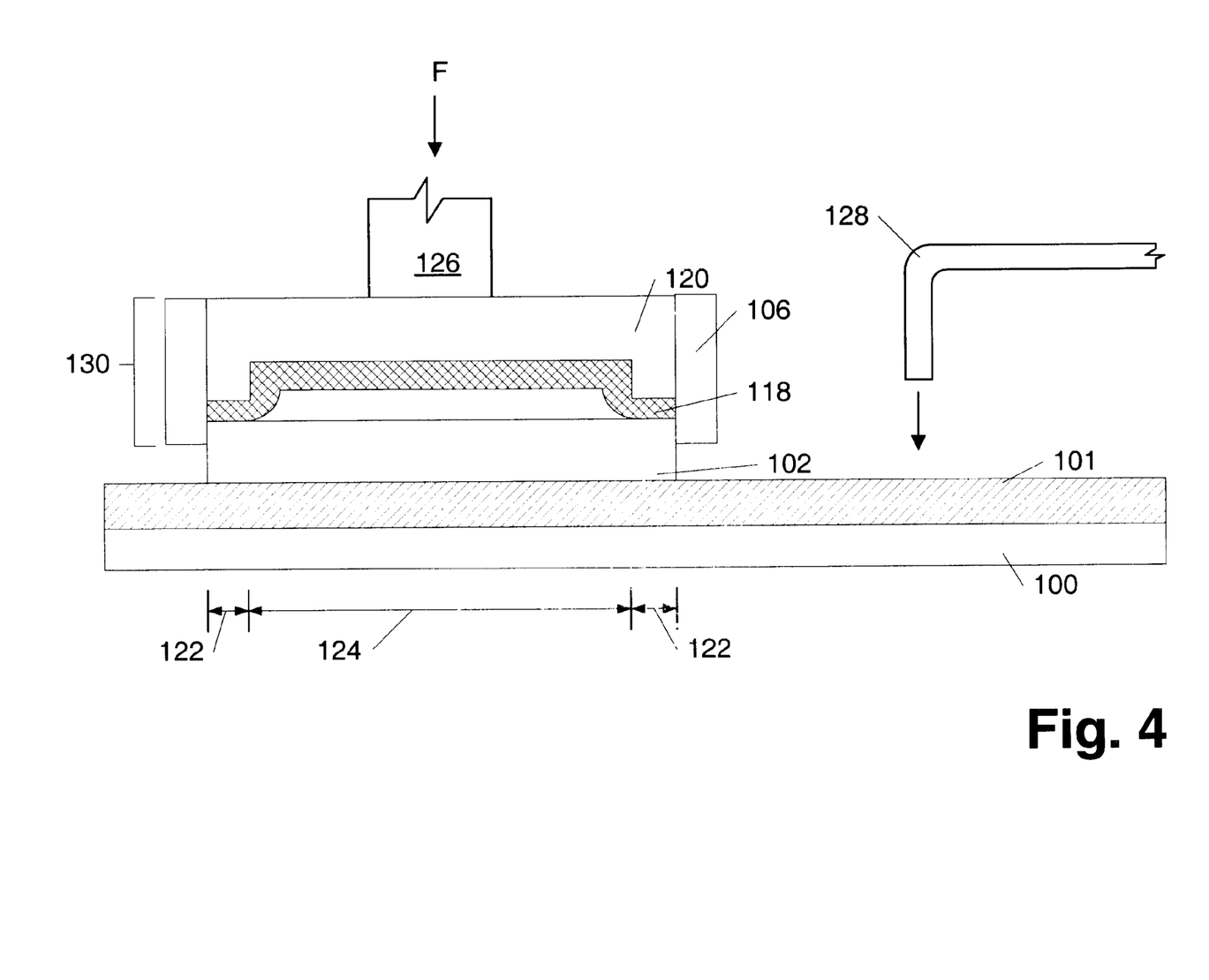
FIG. 4 depicts a partial cross-sectional view of a semiconductor topography pressed against a polishing pad in a chemical-mechanical polishing system, wherein the chemical-mechanical polishing system includes a carrier plate with a recessed section.

An embodiment of the system as described herein is illustrated in FIG. 4. A CMP system is shown including rotatable table or platen 100, polishing pad 101, semiconductor topography 102, carrier ring 106, backing film 118, carrier plate 120, shaft 126, and conduit 128. Wafer carrier 130 may include carrier ring 106, backing film 118, and carrier plate 120. The CMP process involves placing semiconductor topography 102 face-down on a polishing pad 101 which lies on or is attached to a rotatable table or platen 100. Wafer carrier 130 holds semiconductor topography 102 on polishing pad 101 as the pad and the topography are rotated relative to each other. Downward force F is applied to shaft 126, which is attached to the backside of wafer carrier 130 to press semiconductor topography 102 against polishing pad 101. A "slurry" consisting of an abrasive and a fluid-based chemical may be deposited from conduit 128 positioned above polishing pad 101 onto the upper surface of the pad. The slurry may fill the space between pad 101 and the surface of semiconductor topography 102. The rotational movement of polishing pad 101 relative to semiconductor topography 102 causes abrasive particles entrained within the slurry to physically strip the reacted surface material from semiconductor topography 102. In an alternative embodiment, the slurry may be substantially free of abrasive particles. In either embodiment, the pad itself may also physically remove some material from the topological surface of the semiconductor topography 102.

The embodiment of FIG. 4 illustrates a CMP system, which may use various types of wafer carriers. As such, the embodiments of FIGS. 1 and 3 may be included in a CMP system as illustrated in FIG. 4. Alternatively or in addition to the backing film embodiment of FIGS. 1 and 3, the carrier plate of FIG. 4 may be adapted to apply a greater pressure in a first portion of a semiconductor topography than in a second portion of a semiconductor topography. For example, carrier plate 120 may include a recessed section as shown in FIG. 4, such that backing film 118 may comprise a continuous layer conformably formed across and upon the side of carrier plate 120 including the recessed section. In one embodiment, backing film 118 may be of uniform thickness such that the backing film is in contact with at least a portion of semiconductor topography 102. For example, backing film 118 may be adapted to contact semiconductor topography 102 at regions 122. Alternatively, backing film 118 may be a continuous layer of varied thickness depending of the design specifications of the polishing process. For example, backing film 118 may be thicker in the region corresponding to region 122 of the semiconductor topography, as illustrated with backing film 116 in FIG. 3. Alternatively, backing film 118 may be thicker in the region corresponding to region 124 of the semiconductor topography such that the lateral surface of backing film 118 adjacent to semiconductor topography 102 may be substantially planar. In this manner, the entire backing film may be in contact with the topography for a subsequent planarization step. As such, the system may include different configurations of the carrier plate and the backing film. In one embodiment, the polishing process and planarization process may be performed on the same system. Alternatively, the polishing process and planarization process may be performed on two separate systems so that the backing film does not have to be changed. Furthermore, the wafer carriers of FIGS. 1 and 3 may include different configurations of the carrier plate and backing film.

In another embodiment, the backing film of FIG. 4 may be attached to a region of the carrier plate adjacent to the recessed region (not shown). As such, the backing film may have similar dimensions to that of backing film 104 of FIG. 1 when the recessed region is centered in carrier plate 120. Alternatively, the recessed region may be located in any portion of carrier plate 120. As such, the lateral dimensions of the backing film attached to the region of the carrier plate adjacent to the recessed region may be modified to align with such a configuration. In yet another embodiment, the backing film may include two segments (not shown). One segment may be arranged upon a region of the carrier plate adjacent to the recessed region, while another segment may be arranged upon the floor of the recessed section. In this manner, the two segments of the backing film may be separated by the vertical walls of the recessed section. However, the horizontal surfaces of carrier plate 120 may be substantially covered by the backing film.

The lateral dimensions of the recessed portion may be approximately equal to the lateral dimensions of the portion of the topography receiving less pressure during the polishing process. For example, in the embodiment of FIG. 4, the lateral dimensions of the recessed portion of carrier plate 120 may be approximately equal to the lateral dimensions of region 124 of semiconductor topography 102. In one embodiment, the diameter of the recessed portion may be less than a diameter of the carrier plate by an amount between approximately 2 mm and approximately 20 mm. As such, the diameter of region 124 may be less than a diameter of the carrier plate by an amount between approximately 2 mm and approximately 20 mm. The depth of the recessed portion may influence the onset of polishing region 124. In this manner, the depth of the recessed portion may correspond to a thickness variation between the regions 122 and 124 of an upper layer of semiconductor topography 102 subsequent to polishing. In this manner, the depth of the recessed portion may vary depending on the design specifications of the device. In particular, the depth of the recessed portion may be optimized such that a substantially planar upper surface of the semiconductor topography may be obtained by a subsequent planarization process.

Figure 5:
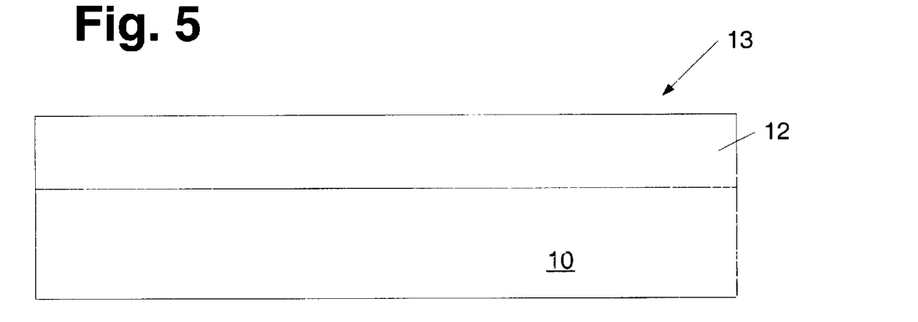
FIG. 5 depicts a partial cross-sectional view of a semiconductor topography in which an upper layer is formed upon a semiconductor layer.

Referring to the method of processing a semiconductor topography as described herein, FIG. 5 depicts a semiconductor topography in which upper layer 12 may be formed upon and in contact with semiconductor layer 10. Semiconductor layer 10 may be a silicon substrate, and may in some embodiments be doped either n-type (for producing a p-channel transistor) or p-type (for an n-channel transistor). More specifically, semiconductor layer 10 may be an epitaxial silicon layer grown on a monocrystalline silicon substrate, or an n-type or p-type well region formed in a monocrystalline silicon substrate. Alternatively, semiconductor layer 10 may include structures and layers formed upon a semiconductor substrate, such as a monocrystalline silicon semiconductor substrate. The structures and layers may include, but are not limited to, gate dielectric layers, gate structures, contact structures, local interconnect wires, additional dielectric layers, or metallization layers. In this manner, semiconductor layer 10 may be substantially planar or may have substantial elevational differences due to the formation of such structures and layers. Diffusion regions (not shown) may also be formed in semiconductor layer 10. For example, diffusion regions may be lightly doped drain regions and heavily doped source/drain regions formed in a semiconductor layer adjacent to gate structures. Furthermore, the semiconductor topography may include shallow trench isolation regions formed within a semiconductor substrate or within a layer formed upon a substrate.

As shown in FIG. 5, upper layer 12 may be formed upon an upper surface of semiconductor layer 10. FIG. 5 illustrates semiconductor layer 10 as being substantially planar, so a conformal deposit of upper layer 12 may yield a substantially planar upper surface. Alternatively, upper layer 12 may be formed upon a lower semiconductor layer having a plurality of nonplanar structures formed upon and spaced across the semiconductor topography. Such an embodiment is described and illustrated in FIG. 11. The thickness of upper layer 12 may be between approximately 6,000 angstroms and approximately 10,000 angstroms. Larger or smaller thicknesses of upper layer 12, however, may be appropriate depending on the semiconductor device being formed. The structure of upper layer 12 upon semiconductor layer 10 may be referred to as semiconductor topography 13.

In an embodiment, upper layer 12 may include any of various layers used in semiconductor fabrication. For example, upper layer 12 may include a polymetal dielectric layer or an intermetal dielectric layer. For example, upper layer 12 may include silicon dioxide ($SiO_2$), tetraorthosilicate glass (TEOS), silicon nitride ($Si_xN_y$), silicon oxynitride ($SiO_xN_y(H_z)$), or silicon dioxide/silicon nitride/silicon dioxide (ONO). In addition, upper layer 12 may be silicon dioxide deposited by a CVD process, which may be nitrided in a subsequent processing step. Upper layer 12 may also be formed from a low-permittivity ("low-k") dielectric, generally known in the art as a dielectric having a dielectric constant of less than about 3.5. One low-k dielectric in current use, which is believed to make a conformal film, is fluorine-doped silicon dioxide. In another embodiment, upper layer 12 may be formed from a high-permittivity ("high-k") dielectric. Appropriate materials for a high-k gate dielectric include, but are not limited to, tantalum pentoxide ($Ta_2O_5$), barium titanate ($BaTiO_3$), and titanium oxide ($TiO_2$). Upper layer 12 may be undoped or may be doped to form, for example, low doped BPSG, low doped PSG, or FSG. Low doped BPSG may have a boron concentration of less than approximately 5% by weight. Low doped PSG may have a phosphorus concentration of less than approximately 6% by weight, and more preferably less than approximately 5% by weight.

Alternatively, upper layer 12 may include a conductive material, such as polysilicon, aluminum, copper, titanium, or a metal alloy. Furthermore, because copper diffuses readily through silicon and oxide, and undesirably alters the electrical properties of transistors formed in silicon, a liner may be deposited on the semiconductor layer before deposition of a copper layer. A liner may preferably be formed from a conductive material, which acts as a diffusion barrier to the overlying copper, and also adheres well to semiconductor layer 10. Materials typically used as a liner, which is often called a diffusion barrier and/or an adhesion layer, may include metal nitrides such as titanium nitride and tantalum nitride, and refractory alloys such as titanium-tungsten. A copper layer may be typically formed using two deposition steps. A thin "seed" layer may be deposited first, followed by a more rapid "fill" deposition. The seed layer may be deposited by sputtering, but other methods such as CVD may also be used. Electroplating is a currently preferred method of depositing a copper layer, but other techniques, including CVD, may be used as well.

Figure 6:
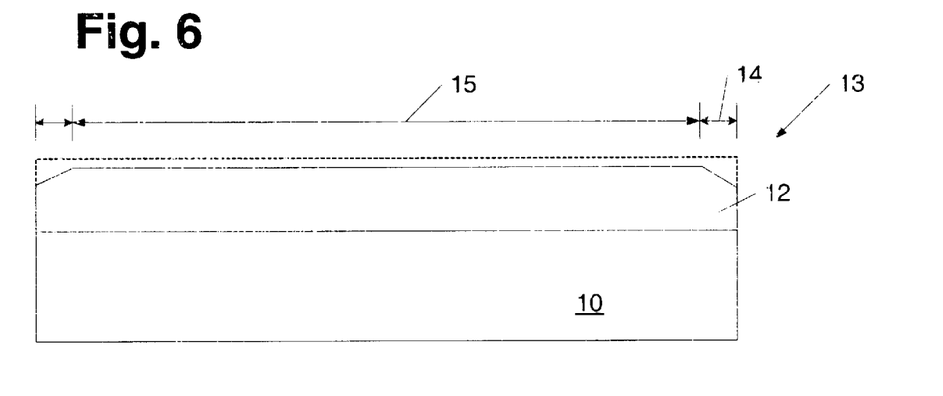
FIG. 6 depicts a partial cross-sectional view of a semiconductor topography in which the upper layer is polished subsequent to the layer formation of FIG. 5, wherein a region of the upper layer adjacent to the outer edge is polished at a faster rate than a region of the upper layer comprising the center of the topography.

FIG. 6 illustrates a polishing process, which polishes a portion of upper layer 12 in region 14 of topography 13 at a faster rate than a portion of the upper layer in region 15 of the topography. As such, an average thickness of the upper layer in region 14 may be less than an average thickness of the upper layer in region 15. In one embodiment, the thickness of the upper layer in region 14 may increase gradually going inward from the outer edge of the topography. In contrast, the thickness of the upper layer in region 15 may be substantially uniform. However, in an embodiment in which upper layer 12 is initially nonplanar, the thickness of the upper layer in regions 14 and 15 may vary nonuniformly. As shown in the embodiment of FIG. 6, region 14 may be adjacent to the outer edge of the semiconductor topography, while region 15 may include the center of the topography. In an embodiment, region 14 may extend inward from the outer edge of the topography by an amount between approximately 1 mm and approximately 10 mm. More specifically, region 14 may extend from the outer edge by an amount between approximately 2 mm and approximately 4 mm. The polishing rate of the upper layer in region 14 may be between approximately 4,000 angstroms/minute and approximately 7,000 angstroms/minute. In contrast, the polishing rate of the upper layer in region 15 may be between approximately 500 angstroms/minute and approximately 1,000 angstroms/minute. As such, the portion of the semiconductor topography polished by the polish step may include the region extending from the outer edge of the semiconductor topography and the region including the center of the topography. However, a greater amount of the topography may be removed in the region extending from the outer edge of the topography than from the region comprising the center of the topography since the polishing rate is so much greater at the edge of the topography. The polishing rate variation across the topography may vary, however, depending on the design specifications of the device. In particular, the polishing rates of the method as described herein may be optimized such that a substantially planar upper surface of the semiconductor topography may be obtained by a subsequent planarization process. As such, any region of upper layer 12 may be polished at a faster rate than another region of upper layer 12 depending on the design adaptations of the polishing system.

The polishing step of FIG. 6 may include placing semiconductor topography 13 upon a carrier plate with a carrier backing film interposed between at least a portion of the backside of the topography and the plate. In one embodiment, the polishing process may include a CMP process. The backing film may include any of the configurations discussed in FIGS. 1–4. In addition or alternatively, the carrier plate may include any of the configurations presented in FIGS. 1–4. In an embodiment, the backing film may be replaced with a continuous backing film layer formed upon and across a substantially planar carrier plate prior to a subsequent planarizing step such that the entire backing film layer is in contact with the topography prior to planarization. In this manner, the polishing and planarizing processes may be performed on the same system. Alternatively, the polishing process and subsequent planarizing process may be performed on two separate systems so that the backing film does not have to be changed.

Figure 7:
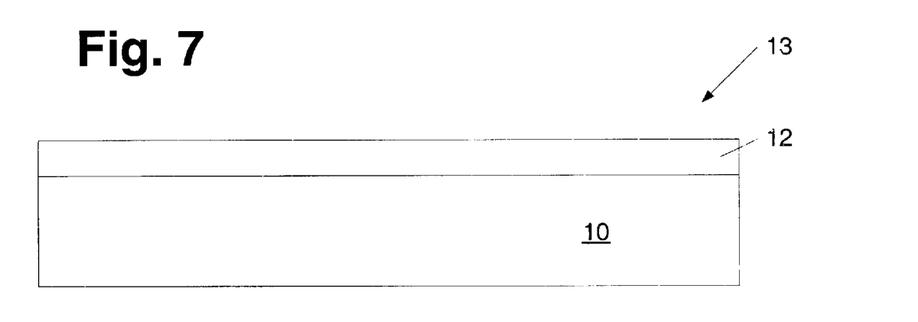
FIG. 7 depicts a partial cross-sectional view of a semiconductor topography in which the upper layer is planarized subsequent to the polishing of FIG. 6 to form a substantially planar upper surface.

FIG. 7 illustrates a planarizing step such that an upper surface of semiconductor topography 13 is substantially planar. In this manner, the thickness of upper layer 12 may be approximately uniform across the entirety of the semiconductor topography. For example, the thickness variation of upper layer 12 across the entirety of semiconductor topography 13 may be less than approximately 700 angstroms. Moreover, the thickness variation of upper layer 12 across the entirety of semiconductor topography 13 may be less than approximately 350 angstroms. Planarizing may include applying a pressure that is substantially the same across the entirety of the semiconductor topography. In one embodiment, planarizing may include a CMP process in which a pressure may be applied to the backside of the semiconductor topography. The planarization rate of a uniform pressure system may vary across the topography due to a number of variables involved in the process. As such, the planarization rate of the region adjacent to the outer edge of the semiconductor topography may be slightly slower than the planarization rate of the region comprising the center of the topography. For example, the planarization rate of upper layer 12 in the region 15 may be between approximately 2500 angstroms/minute and approximately 2700 angstroms/minute. By contrast, the planarization rate of upper layer 12 in the region 14 may be approximately 2000 angstroms/minute.

As previously stated, upper layer 12 may be formed upon a lower semiconductor layer having a plurality of nonplanar structures formed upon and spaced across the semiconductor topography. For example, upper layer 12 may include a dielectric layer conformably deposited over a plurality of trenches formed within and spaced across a semiconductor topography. In one embodiment, the upper layer may be formed upon and in contact with a polish stop layer. For example, the polish stop layer may be formed upon an upper surface of the semiconductor topography and adjacent to features formed in the semiconductor topography such as trenches. The polish stop layer may include, for example, silicon nitride. Appropriate materials for a polish stop layer, however, may also include any material having a substantially different polish response than the upper layer. In this manner, polishing and/or planarizing may include exposing an upper surface of the polish stop layer. As such, subsequent to planarizing, an upper surface of the upper layer within a trench formed in the semiconductor topography may be substantially coplanar with an upper surface of the polish stop layer. Alternatively, subsequent to planarizing, an upper surface of the upper layer may be below an upper surface of a polish stop layer formed adjacent to the trench. FIGS. 8–14 illustrate such an embodiment.

Figure 8:
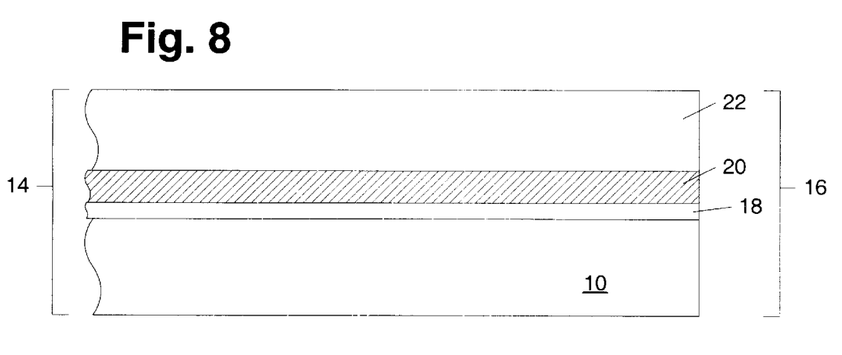
FIG. 8 depicts a partial cross-sectional view of a semiconductor topography in which an oxide layer, a polish stop layer, and a resist are formed upon a semiconductor layer.

FIG. 8 depicts a semiconductor topography in which oxide layer 18 may be formed upon and in contact with semiconductor layer 10. Moreover, polish stop layer 20 may be formed upon and in contact with oxide layer 18, and resist 22 may be formed upon and in contact with polish stop layer 20. Semiconductor layer 10 was described with reference to FIGS. 5–7. As such, semiconductor layer 10 may include a semiconductor substrate or a substrate including one or more layers, structures, and/or regions formed upon and/or within the substrate. These layers, structures, and regions may be planarized to provide a substantially planar upper surface. Alternatively, semiconductor layer 10 may have a substantially nonplanar upper surface. As illustrated in FIG. 8, lateral surface 14 of the semiconductor topography is drawn to indicate the continuation of the semiconductor topography toward a center portion of the semiconductor topography. On the contrary, lateral surface 16 of the semiconductor topography is drawn to indicate the outer edge of the semiconductor topography.

Oxide layer 18 may aid in the adhesion of polish stop layer 20 to semiconductor layer 10. For example, the inclusion of an oxide layer may promote adhesion of a silicon nitride layer, which may serve as polish stop layer 20, upon a silicon layer, which may serve as semiconductor layer 10. In another embodiment, oxide layer 18 may also serve as a "pad oxide" to reduce inherent stresses between a nitride polish stop layer and a silicon substrate. Oxide layer 18 may be grown upon semiconductor layer 10 using wet or dry thermal oxidation of a silicon substrate. Alternatively, oxide layer 18 may be deposited on semiconductor layer 10 using chemical-vapor deposition ("CVD") from, for example, a gas which may include $SiH_4$ and $O_2$. Oxide layer 18 may have a thickness of, for example, from approximately 50 angstroms to approximately 250 angstroms, preferably approximately 70 angstroms to approximately 150 angstroms, and in one embodiment, approximately 100 angstroms. Oxide layer 18 may include a dielectric layer, such as silicon dioxide ($SiO_2$), tetraorthosilicate glass (TEOS), or silicon dioxide/silicon nitride/silicon dioxide (ONO). Alternatively, polish stop layer 20 may be formed upon semiconductor layer 10 without oxide layer 18.

Polish stop layer 20 may serve to protect portions of underlying layers and structures within semiconductor layer 10. For example, polish stop layer 20 may protect portions of oxide layer 18 and semiconductor 10 from an etch process which may be used to form trenches within semiconductor layer 10. Polish stop layer 20 may also serve as a stop layer for polishing and planarizing processes as described herein. In this manner, the polishing and planarizing of overlying layers may be substantially terminated upon exposing polish stop layer 20. Consequently, structures or layers formed upon semiconductor layer 10 adjacent to polish stop layer 20 may also be polished or planarized to approximately the same elevation level as polish stop layer 20. Alternatively, structures or layers formed upon semiconductor layer 10 adjacent to polish stop layer 20 may also be recessed to an elevational level below polish stop layer 20. Polish stop layer 20 may include silicon nitride deposited by thermally decomposing silane and ammonium in a chemical vapor deposition process maintained at a temperature in the range of approximately 200° C. to approximately 800° C. Appropriate materials for polish stop layer 20, however, may also include any material having a substantially different polish response than upper layer 12. Polish stop layer 20 may have, for example, a thickness from approximately 500 angstroms to approximately 2,000 angstroms and preferably approximately 1,200 angstroms to approximately 1,700 angstroms.

Figure 9:
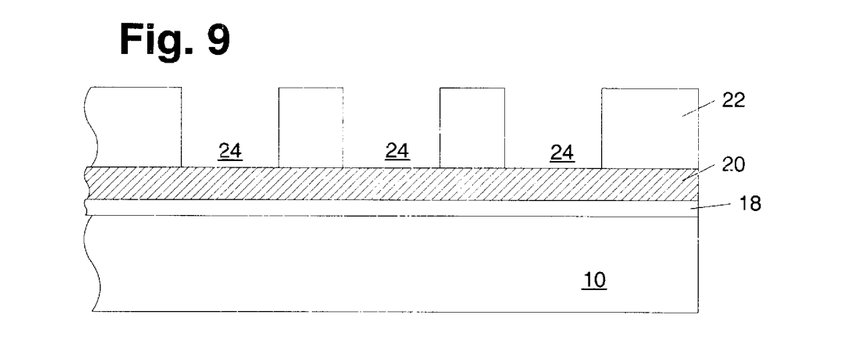
FIG. 9 depicts a partial cross-sectional view of a semiconductor topography in which the resist is patterned subsequent to the resist formation of FIG. 8.
Figure 10:
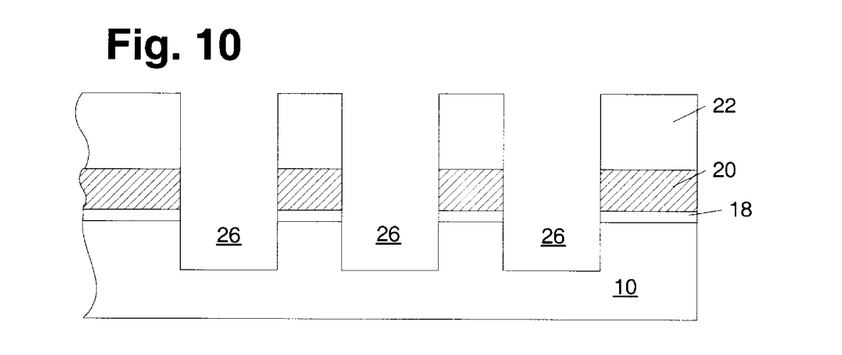
FIG. 10 depicts a partial cross-sectional view of a semiconductor topography in which trenches are formed within the semiconductor layer subsequent to the patterning of FIG. 9.

In an embodiment, resist 22 may be formed upon polish stop layer 20. Resist 22 may include a photoresist, such as a deep ultraviolet resist, an I-line resist, a G-line resist, or another resist, such as an e-beam resist or an x-ray resist. Resist 22 may be patterned using a lithography technique, thus exposing portions 24 of polish stop layer 20 as shown in FIG. 9. Exposed portions 24 of polish stop layer 20 and underlying portions of oxide layer 18 and semiconductor layer 10 may be etched to form trenches 26 as shown in FIG. 10. The etch process may include wet etch and/or dry etch techniques. The patterned photoresist may then be removed by a stripping process such as a wet etch or a reactive ion etch stripping process. Trenches 26 may be used to form shallow trench isolation regions within semiconductor layer 10. Isolation regions may be field oxide regions, which may serve to isolate separate active regions on semiconductor layer 10 from one another. Although FIG. 10 illustrates the formation of three trenches across semiconductor layer 10, any number of trenches may be formed across the semiconductor layer in accordance with design specifications of the device. As such, semiconductor layer 10 may include several trenches within the region extending from the edge of the semiconductor topography. In addition, various widths and depths of the trenches may be formed in accordance with the design specifications of the device.

Figure 11:
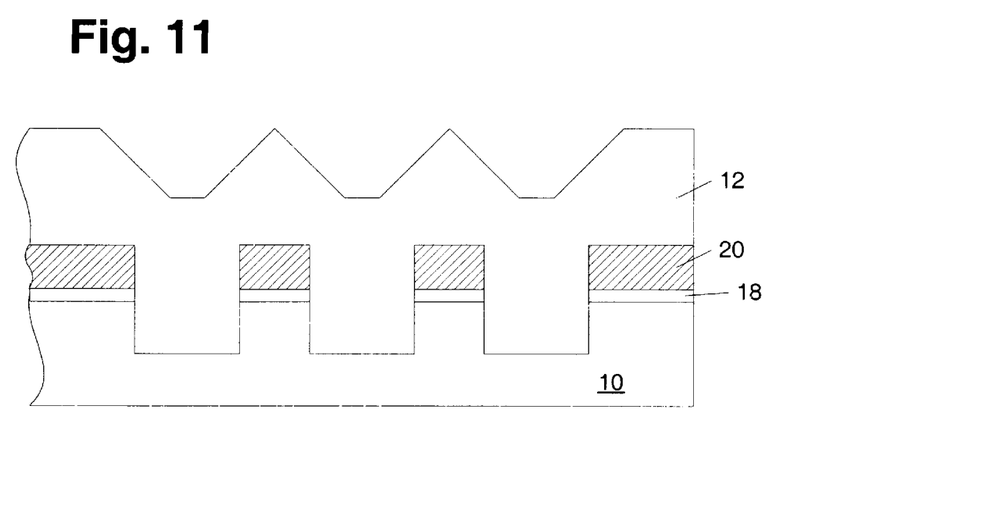
FIG. 11 depicts a partial cross-sectional view of a semiconductor topography in which an upper layer is formed within the trenches and above the polish stop layer subsequent to the trench formation of FIG. 10.

Trenches 26 may be filled with upper layer 12 as shown in FIG. 11. Upper layer 12 may also be formed upon an upper surface of polish stop layer 20, which may be formed adjacent to trenches 26. Upper layer 12 was described in reference to FIGS. 5–7. Generally, upper layer 12 may be deposited conformally and thus, may have a non-planar upper surface as shown in FIG. 11. The planarity of the upper layer may be defined by the thickness variation of the upper layer across the entirety of the semiconductor topography with respect to an underlying plane within the topography. On the other hand, the planarity of the upper layer may be determined by measuring an average thickness of the layer in one region of the semiconductor topography as compared to the average thickness of the layer in another region of the semiconductor topography. Alternatively, upper layer 12 may be relatively planar if the underlying structures and layers are substantially planar before the deposition of upper layer 12 as is shown in FIG. 5.

Figure 12:
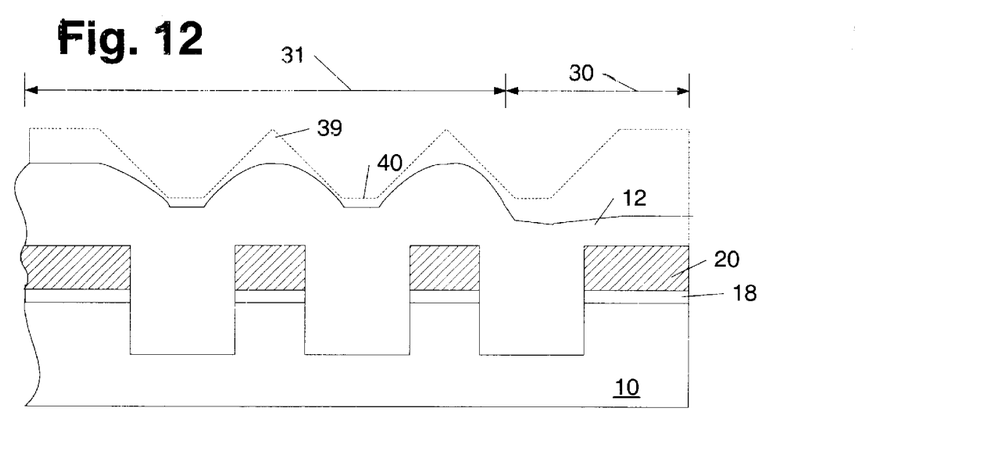
FIG. 12 depicts a partial cross-sectional view of a semiconductor topography in which the upper layer is polished subsequent to the upper layer formation of FIG. 11, wherein a region of the upper layer adjacent to the outer edge is polished at a faster rate than a region of the upper layer comprising the center of the topography.
Figure 13:
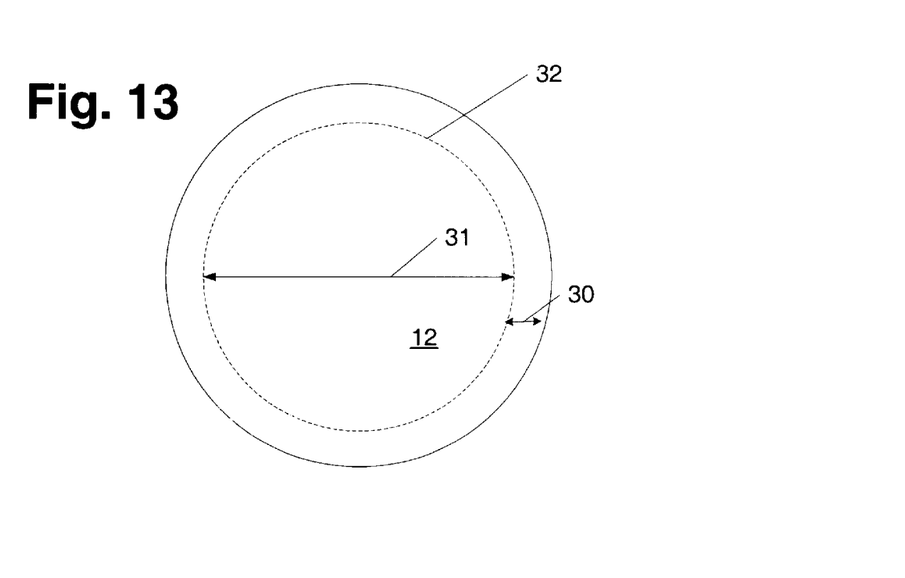
FIG. 13 depicts a top view of the semiconductor topography of FIG. 12.

FIG. 12 illustrates exemplary result of polishing upper layer 12 such that region 30 of the semiconductor topography is polished at a faster rate than region 31. As such, an average thickness of the upper layer in region 30 may be less than an average thickness of the upper layer in region 31. However, in contrast to region 14 in FIG. 6, region 30 may not increase gradually going inward from the outer edge of the topography since region 30 of upper layer 12 was substantially nonplanar in FIG. 11. Similarly, region 31 in FIG. 12 may be substantially nonplanar due to the nonplanarity of upper layer 12 in FIG. 11. In particular, the method described herein may be useful in compensating nonuniformity in any regions of the semiconductor topography. As denoted in FIG. 12, peaks 39 of upper layer 12 may be polished at a faster rate than valleys 40 due to the contact of such peaks with the polishing pad.

Regions 30 and 31 may be situated in any location of the semiconductor topography. For example, region 30 may be adjacent to the outer edge of the semiconductor topography, while region 31 may include the center of the topography. More specifically, region 30 may extend inward from the outer edge of the topography by an amount between approximately 1 mm and approximately 10 mm. In one embodiment, region 30 may extend from the outer edge by an amount between approximately 2 mm and approximately 4 mm. The top view of such a topography may look substantially similar to FIG. 13. Region 30 may be arranged adjacent to the periphery of the semiconductor topography, while region 31 may include a center of the topography. Dotted line 32 depicts the interface between regions 30 and 31.

As stated above, the process of polishing an upper layer of a semiconductor topography may include polishing the portion of the upper layer in the region adjacent to an outer edge of the semiconductor topography at a faster rate than a portion of the upper layer in a region comprising the center of the semiconductor topography. For example, the polishing rate of the upper layer in region 30 may be between approximately 4,000 angstroms/minute and approximately 7,000 angstroms/minute. In contrast, the polishing rate of the upper layer in region 31 may be between approximately 500 angstroms/minute and approximately 1,000 angstroms/minute. The polishing rate variation across the topography may vary, however, depending on the design specifications of the device. In particular, the polishing rates of the method as described herein may be optimized such that a substantially planar upper surface of the semiconductor topography may be obtained by a subsequent planarization process.

Figure 14:
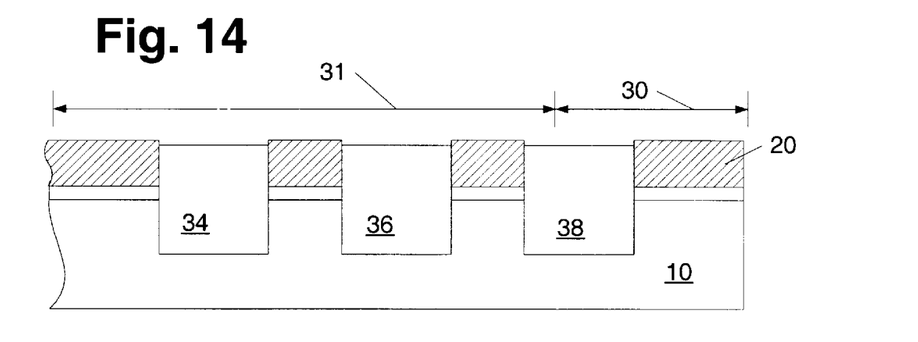
FIG. 14 depicts a partial cross-sectional view of a semiconductor topography in which the semiconductor topography is planarized subsequent to the polishing of FIG. 12 to form a substantially planar upper surface.

The upper surface of upper layer 12 may be planarized such that the upper surface of the semiconductor topography may be substantially planar as illustrated in FIG. 14. In this manner, the thickness of upper layer 12 of the semiconductor topography may be approximately the same across the entirety of the semiconductor topography. For example, the thickness variation of the upper layer across the entirety of the semiconductor topography may be less than approximately 700 angstroms. In one embodiment, the thickness variation of the upper layer across the entirety of the semiconductor topography may be less than approximately 350 angstroms. Planarizing may include polishing the semiconductor topography at a substantially different polish rate profile than the polishing step. Such a process may include a slower rate of polishing adjacent to the outer edge of the semiconductor topography than that of the polishing rate at the center of the semiconductor topography. However, since a greater portion of upper layer 12 within region 30 of the semiconductor topography may have been removed, a substantially planar surface may be obtained across the semiconductor surface.

The polish rate variation across the topography may be due to a number of variables involved in the planarization process. In an embodiment, the planarization step may apply a substantially uniform pressure across the topography to obtain its polish rate profile. In another embodiment, the planarization step may assert a substantially uniform pressure across the topography except in the region adjacent to the outer edge of the topography. In one embodiment, planarizing may include a CMP process. In such an embodiment, the CMP system may not include the modified wafer carrier components as may be used in the polishing step. In other words, the CMP system used for the planarization step may include a CMP system configuration commonly used in semiconductor fabrication. Alternatively, the planarization step may include any process which polishes a region at the outer edge of the topography at a slightly slower rate than a region including the center of the topography.

The planarization process may include exposing an upper surface of polish stop layer 20. As such, other structures and layers may be elevationally adjacent to polish stop layer 20 subsequent to the planarization process. In FIG. 14, upper layer 12 may be formed within trenches 26 to form, for example, shallow isolation regions 34, 36, and 38. Thus, the polished upper surface of upper layer 12 within the isolation trenches may be coplanar with an upper surface of polish stop layer 20 formed adjacent to isolation regions 34, 36, and 38. Alternatively, the planarization process may include polishing the upper surface of the upper layer to a level spaced above or below the polish stop layer. In addition, a semiconductor device may be arranged within the region adjacent to the outer edge of the semiconductor topography. In particular, a semiconductor device may be arranged approximately 4 mm from the outer edge of a semiconductor topography.

It will be appreciated to those skilled in the art having the benefit of this disclosure that this invention is believed to provide a method, a wafer carrier, components of a wafer carrier, and a CMP system for processing a semiconductor topography. Further modifications and alternative embodiments of various aspects of the invention will be apparent to those skilled in the art in view of this description. For example, the methods described herein could be applied not just to polishing a layer formed upon a semiconductor layer, but to polishing any semiconductor feature or layer which may include polishing a region of the topography at a faster rate than in another region of the topography. In addition, the rate varied polishing step as described herein may be performed prior to or subsequent to the planarization step. Furthermore, the method and devices described herein may be adapted for wafers of any size (i.e., 6 inch, 8 inch, or 12 inch diameter wafers). For example, the region adjacent to the outer edge of the semiconductor topography may vary with wafer size. It is intended that the following claims be interpreted to embrace all such modifications and changes and, accordingly, the drawings and the specification are to be regarded in an illustrative rather than a restrictive sense.

What is claimed is:

1. A method for processing a semiconductor topography, comprising:

polishing an upper layer of the semiconductor topography such that a portion of the upper layer in a region adjacent to an outer edge of the semiconductor topography is polished at a faster rate than a portion of the upper layer in a region comprising the center of the semiconductor topography to form a substantially non-planar surface; and subsequently planarizing the semiconductor topography such that its upper surface is substantially planar.

2. The method of claim 1, wherein an average thickness of the upper layer in the region adjacent to the outer edge of the semiconductor topography subsequent to polishing is less than an average thickness of the upper layer in the region comprising the center of the semiconductor topography.

3. The method of claim 1, wherein a thickness of the upper layer in the region adjacent to the outer edge of the semiconductor topography subsequent to polishing increases gradually going inward from the outer edge of the topography.

4. The method of claim 1, wherein the region adjacent to the outer edge of the semiconductor topography extends inward from the outer edge of the semiconductor topography by an amount between approximately 1 mm and approximately 10 mm.

5. The method of claim 4, wherein the region adjacent to the outer edge of the semiconductor topography extends inward from the outer edge of the semiconductor topography by an amount between approximately 2 mm and approximately 4 mm.

6. The method of claim 1, wherein said faster rate comprises between approximately 4,000 angstroms/minute and approximately 7,000 angstroms/minute.

7. The method of claim 1, wherein said upper layer comprises a conductive material.

8. The method of claim 1, wherein said upper layer comprises a dielectric.

9. The method of claim 1, wherein said polishing comprises applying a greater pressure in the region adjacent to the outer edge of the semiconductor topography than the region comprising the center of the semiconductor topography.

10. The method of claim 9, wherein said polishing further comprises placing the semiconductor topography upon a carrier plate prior to said applying a greater pressure, and wherein a carrier backing film is interposed between at least a portion of the wafer and the plate.

11. The method of claim 10, wherein the backing film comprises a continuous layer conformably formed across and upon a surface of the plate, wherein said surface comprises a recessed section such that only a segment of the film contacts the semiconductor wafer prior to said applying a greater pressure, and wherein lateral dimensions of the segment are approximately equal to lateral dimensions of the region adjacent to the outer edge of the semiconductor topography.

12. The method of claim 10, wherein the carrier backing film comprises a ring aligned with an outer portion of the carrier plate, and wherein lateral dimensions of the ring are approximately equal to the lateral dimensions of the region adjacent to the outer edge of the semiconductor topography.

13. The method of claim 1, wherein a thickness variation of the upper layer across the entirety of the semiconductor topography, subsequent to said planarizing, is less than approximately 700 angstroms.

14. The method of claim 13, wherein the thickness variation of the upper layer across the entirety of the semiconductor topography, subsequent to said planarizing, is less than approximately 350 angstroms.

15. The method of claim 1, wherein said planarizing comprises applying a pressure that is substantially the same across the entirety of the semiconductor topography.

16. The method of claim 1, wherein said polishing and planarizing are performed by two separate systems.

17. The method of claim 1, further comprising replacing a backing film ring with a continuous backing film layer prior to said planarizing, wherein said polishing and planarizing are performed on the same system.

18. A method for polishing a semiconductor topography, comprising:

applying a greater pressure in a first portion of the topography than in a second portion of the topography to form a substantially non-planar surface;

subsequently directing a substantially uniform pressure across the entirety of the semiconductor topography to form a substantially planar surface.

19. The method of claim 18, wherein said first portion is polished at a faster rate than said second portion.

20. The method of claim 18, wherein said first portion comprises a region adjacent to the outer edge of the semiconductor topography.

21. The method recited in claim 18, further comprising placing the first portion of the semiconductor topography against a first carrier backing film prior to the step of applying, wherein lateral dimensions of the first carrier backing film are approximately equal to the lateral dimensions of the first portion.

22. The method recited in claim 21, further comprising replacing the first carrier backing film with a second carrier backing film subsequent to the step of polishing and prior to the step of planarizing, wherein the second carrier backing film comprises lateral dimensions approximately equal to or greater than the lateral dimensions of the semiconductor topography.

23. The method recited in claim 18, wherein a difference between the average thickness of an upper layer across the entirety of the first portion of the semiconductor topography and the average thickness of the upper layer across the entirety of the second portion of the semiconductor topography is less than approximately 703 angstroms.

* * * * *

UNITED STATES PATENT AND TRADEMARK OFFICE
CERTIFICATE OF CORRECTION

PATENT NO. : 6,509,270 B1　　　　　　　　　　　　　　　　　　　　　　　Page 1 of 1
DATED : January 21, 2003
INVENTOR(S) : Held It is certified that error appears in the above-identified patent and that said Letters Patent is hereby corrected as shown below:

<u>Column 20,</u>
Line 59, after the phrase "less than approximately" please delete "703" and substitute therefor -- 700 --.

Signed and Sealed this

Third Day of June, 2003

JAMES E. ROGAN
*Director of the United States Patent and Trademark Office*